United States Patent
Cheng

(10) Patent No.: US 9,300,877 B2
(45) Date of Patent: Mar. 29, 2016

(54) OPTICAL ZOOM IMAGING SYSTEMS AND ASSOCIATED METHODS
(71) Applicant: OmniVision Technologies, Inc., Santa Clara, CA (US)
(72) Inventor: Tingyu Cheng, New Taipei (TW)
(73) Assignee: OmniVision Technologies, Inc., Santa Clara, CA (US)
( * ) Notice: Subject to any disclaimer, the term of this patent is extended or adjusted under 35 U.S.C. 154(b) by 92 days.
(21) Appl. No.: 14/270,318
(22) Filed: May 5, 2014
(65) Prior Publication Data
US 2015/0319368 A1 Nov. 5, 2015
(51) Int. Cl.
*H04N 5/232* (2006.01)
*H01L 27/146* (2006.01)
*G03B 13/32* (2006.01)
(52) U.S. Cl.
CPC ........... *H04N 5/23296* (2013.01); *G03B 13/32* (2013.01); *H01L 27/14601* (2013.01)
(58) Field of Classification Search
CPC ..................... H04N 5/23296; H01L 27/14601; G03B 13/32; G03B 2205/0046; G02B 3/0006–3/0075; G02B 7/04–7/105; G02B 7/282; G02B 13/009; G02B 15/00–15/28; G08B 13/1963; G08B 13/19689
See application file for complete search history.

(56) References Cited

U.S. PATENT DOCUMENTS

| | | | | |
|---|---|---|---|---|
| 7,729,602 B2 * | 6/2010 | Janson, Jr. | ............. | G03B 15/00 348/218.1 |
| 8,228,417 B1 * | 7/2012 | Georgiev | ............. | G03F 11/00 348/335 |
| 8,289,409 B2 * | 10/2012 | Chang | ............. | G03B 17/12 348/218.1 |
| 9,083,873 B1 * | 7/2015 | Lewkow | ............. | G02B 7/021 |
| 2006/0044634 A1 * | 3/2006 | Gruhlke | ............. | H04N 1/486 358/505 |
| 2006/0054782 A1 * | 3/2006 | Olsen | ............. | G02B 3/0062 250/208.1 |
| 2006/0275025 A1 * | 12/2006 | Labaziewicz | ............. | H04N 5/225 396/72 |
| 2007/0126898 A1 * | 6/2007 | Feldman | ............. | G02B 9/12 348/294 |
| 2008/0018779 A1 * | 1/2008 | Gomi | ............. | H04N 5/2253 348/369 |
| 2009/0148061 A1 * | 6/2009 | Zalevsky | ............. | H04N 5/23296 382/264 |
| 2009/0268043 A1 * | 10/2009 | Olsen | ............. | G02B 3/0062 348/218.1 |
| 2010/0097491 A1 * | 4/2010 | Farina | ............. | H04N 9/045 348/223.1 |
| 2010/0328471 A1 * | 12/2010 | Boland | ............. | G02B 13/004 348/207.99 |
| 2011/0069189 A1 * | 3/2011 | Venkataraman | .. | H01L 27/14618 348/218.1 |
| 2011/0080487 A1 * | 4/2011 | Venkataraman | ..... | H04N 5/2253 348/218.1 |
| 2011/0134282 A1 * | 6/2011 | Morita | ............. | G02B 3/0043 348/234 |
| 2012/0104525 A1 * | 5/2012 | Wu | ............. | G02B 3/0018 257/432 |
| 2014/0176767 A1 * | 6/2014 | Hamel | ............. | H04N 5/23296 348/240.2 |
| 2014/0285693 A1 * | 9/2014 | Kobayashi | ............. | G02B 3/0062 348/294 |
| 2015/0070781 A1 * | 3/2015 | Cheng | ............. | G02B 13/009 359/696 |
| 2015/0156478 A1 * | 6/2015 | Ono | ............. | H04N 5/2251 348/49 |

* cited by examiner

Primary Examiner — Aung S Moe
(74) Attorney, Agent, or Firm — Lathrop & Gage LLP

(57) ABSTRACT

An optical zoom imaging system includes (1) first and second image sensors disposed on a common substrate, and (2) first and second optical blocks in optical communication with the first and second image sensors, respectively. The first and second optical blocks have different respective magnifications. An array includes a plurality of the optical zoom imaging systems. A method for imaging a scene includes the following steps: (1) generating first image data representing the scene at a first zoom level using a first optical block in optical communication with a first image sensor, (2) generating second image data representing the scene at a second zoom level using a second optical block in optical communication with a second image sensor, the second zoom level being different from the first zoom level, and (3) selecting between the first image data and the second image data based on a desired zoom level.

9 Claims, 4 Drawing Sheets

OPTICAL ZOOM IMAGING SYSTEMS AND ASSOCIATED METHODS

BACKGROUND

Zoom imaging systems are well known. In zoom imaging systems, the system's magnification may be varied, thereby allowing flexibility in imaging a scene. For example, if a close-up view of a small portion of the scene is desired, the magnification may be set to a large value, thereby allowing the imaging system to focus on the small scene portion. On the other hand, if an image of the entire scene is desired, the magnification may be set to a small value, thereby allowing the imaging system to capture the entire scene. Zoom imaging may be achieved using optical zoom techniques, digital zoom techniques, or both.

Conventional optical zoom techniques vary the position and/or configuration of imaging system optics, thereby varying magnification and associated field of view. For example, in some conventional cameras, magnification is varied by changing position of optics relative to an image sensor. Image resolution typically remains substantially unchanged as magnification changes, and optical zoom techniques may therefore generate high resolution images across a range of magnification. However, conventional optical zoom techniques normally require moving parts, which is a significant drawback, because moving parts typically (1) add to the imaging system's size, (2) increase the imaging system's cost and complexity, and/or (3) reduce the imaging system's reliability.

Digital zoom techniques, on the other hand, crop an original image down to a desired portion, and then enlarge the cropped image to the same size as the original image. Thus, digital zoom techniques do not require use of moving parts. However, the zoom image will have a lower resolution than original image. While interpolation may be used to increase the resolution of the zoom image, interpolation cannot add information that is missing from the zoom image. Therefore, digital zoom techniques generally suffer from image quality degradation at narrow-zoom levels.

Wafer-level fabrication techniques have been developed to mass produce imaging systems. These techniques typically include forming a large number of image sensors, such as complementary metal oxide semiconductor (CMOS) image sensors, on a single substrate. Respective optics are then disposed on each image sensor to form an assembly including a plurality of imaging systems, which may be subsequently divided into a number of smaller assemblies of one or more imaging systems. Passivation material may be applied before and/or after division of the assemblies. These wafer-level fabrication techniques may allow a large number of imaging systems to be cost-effectively produced.

SUMMARY

In an embodiment, an optical zoom imaging system includes (1first and second image sensors disposed on a common substrate, and (2) first and second optical blocks in optical communication with the first and second image sensors, respectively. The first and second optical blocks have different respective magnifications.

In an embodiment, an array includes a plurality of optical zoom imaging systems. Each of the plurality of optical zoom imaging systems includes (1) first and second image sensors, and (2) first and second optical blocks in optical communication with the first and second image sensors, respectively. In each of the plurality of optical zoom imaging systems, the first and second optical blocks have different respective magnifications.

In an embodiment, a method for imaging a scene includes the following steps: (1) generating first image data representing the scene at a first zoom level using a first optical block in optical communication with a first image sensor, (2) generating second image data representing the scene at a second zoom level using a second optical block in optical communication with a second image sensor, the second zoom level being different from the first zoom level, and (3) selecting between the first image data and the second image data based on a desired zoom level.

DETAILED DESCRIPTION OF THE EMBODIMENTS

Applicant has developed optical zoom imaging systems which do not require moving parts. Certain embodiments of these systems may therefore be smaller, cheaper, less complex, and/or more reliable than typical conventional optical zoom imaging systems. Additionally, some embodiments are compatible with wafer level fabrication techniques, thereby promoting low cost fabrication of large quantities of zoom imaging systems.

Figure 1:
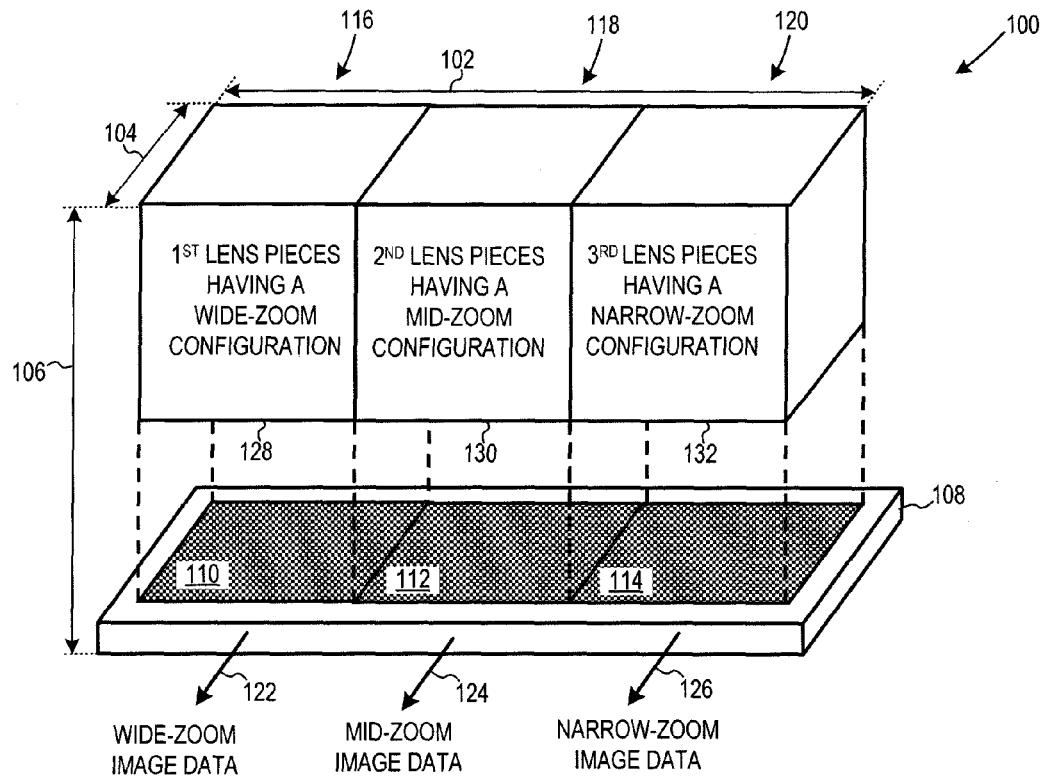
FIG. 1 is a perspective view of an optical zoom imaging system, according to an embodiment.

FIG. 1 is a perspective view of an optical zoom imaging system 100 having a length 102, a width 104, and a height 106. Optical zoom imaging system 100 includes a substrate 108, a first image sensor 110, a second image sensor 112, a third image sensor 114, a first optical block 116, a second optical block 118, and a third optical block 120. Image sensors 110, 112, 114 are disposed in a row in the lengthwise 102 direction on substrate 108, and the image sensors are, for example, CMOS or charge coupled device (CCD) image sensors including an array of pixels. Each array of pixels optionally includes a color filter array, such as a Bayer color filter array, a cyan-yellow-green-magenta color filter array, or a red-green-blue-emerald color filter array. Image sensors 110, 112, 114 generate image data 122, 124, 126, respectively, in response to light incident thereon. In some embodiments, image sensors 110, 112, and 114 are each formed on substrate 108 using wafer-level fabrication techniques.

Optical blocks 116, 118, 120, which are partially delineated by dashed lines in FIG. 1, are disposed in the height 106 direction on image sensors 110, 112, 114, respectively, to form image sensor/optical block pairs. First optical block 116 is in optical communication with first image sensor 110 to form a first image sensor/optical block pair, second optical block 118 is in optical communication with second image sensor 112 to form a second optical block/image sensor pair, and third optical block 120 is in optical communication with third image sensor 114 to form a third optical block/image sensor pair. First optical block 116 includes one or more first lens pieces 128, second optical block 118 includes one or more second lens pieces 130, and third optical block 120 includes one or more third lens pieces 132. Optical blocks 116, 118, 120 may include additional elements, such as apertures and/or filters, without departing from the scope hereof. Each optical block 116, 118, 120 has a different optical configuration, such that each optical block has a different magnification. Therefore, the image sensor/optical block pairs have respective field of view areas of different sizes, in their respective object planes.

For example, in the embodiment shown, first image sensor 110 and first optical block 116 have a relatively large field of view area in their object plane, such that first image sensor 110 generates first image data 122 representing a wide-zoom level. Second image sensor 112 and second optical block 118 have a mid-size field of view area in their object plane, such that second image sensor 112 generates second image data 124 representing a mid-zoom level. Third image sensor 114 and third optical block 120 have a relatively small field of view area in their object plane, such that third image sensor 114 generates third image data 126 representing a narrow-zoom level.

Accordingly, optical zoom imaging system 100 has three discrete optical zoom levels, and a desired optical zoom level may be achieved simply by selecting between first image data 122, second image data 124, and third image data 126. For example, if a wide-zoom level is desired, first image data 122 is selected for use, such as for display, storage, and/or post processing. On the other hand, if a mid-zoom level is desired, second image data 124 is instead selected for use. If a narrow-zoom level is desired, third image data 126 is instead selected for use. Thus, zoom imaging system 100 is capable of changing zoom level without use of moving parts. In some embodiments, image sensors 110, 112, 114 concurrently generate first image data 122, second image data 124, and third image data 126, respectively, while in other embodiments, only a subset of image sensors 110, 112, 114 generate respective image data at a given time. For example, in one particular embodiment, only one of first, second, and third sensors 110, 112, 114 is selected to generate image data at a given time, according to a desired zoom level of optical zoom imaging system 100.

Although it is anticipated that only one of image data 122, 124, 126 will typically be used at a given time, image data from two or more of the image sensors could be simultaneously used without departing from the scope hereof. For example, image data generated by each of image sensors 110, 112, 114 could be simultaneously used, such as to simultaneously generate wide-zoom, mid-zoom, and narrow-zoom level images.

Figure 2:
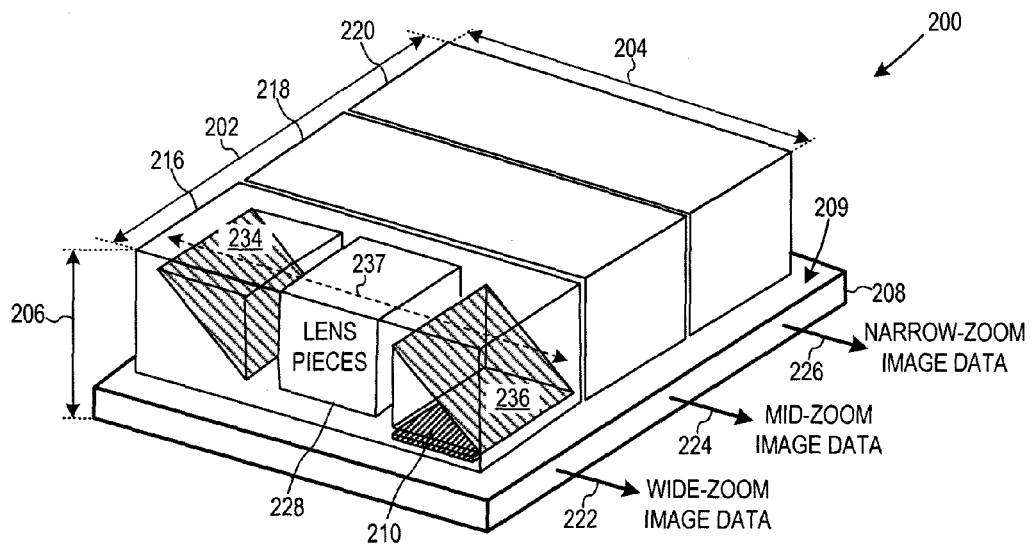
FIG. 2 is a perspective view of another optical zoom imaging system, according to an embodiment.

FIG. 2 is a perspective view of another optical zoom imaging system 200 having a length 202, a width 204, and a height 206. Optical zoom imaging system 200 is similar to optical zoom imaging system 100 of FIG. 1, but as discussed below, system 200 has different optical blocks than system 100.

Optical imaging system 200 includes a substrate 208 having an outer surface 209, a first image sensor 210, a second image sensor 212, a third image sensor 214, a first optical block 216, a second optical block 218, and a third optical block 220. Second and third image sensors 212, 214, and features of second and third optical blocks 218 and 220, are not shown in FIG. 2 to promote illustrative clarity. However, FIGS. 3-5 respectively show features of first, second, and third optical blocks 216, 218, 220, and FIGS. 3-5 also respectively show first, second, and third image sensors 210, 212, 214.

Image sensors 210, 212, 214 are similar to image sensors 110, 112, and 114, respectively, of FIG. 1, and image sensors 210, 212, 214 are disposed in a row in the lengthwise 202 direction on outer surface 209 of substrate 208. Image sensors 210, 212, 214 generate image data 222, 224, 226, respectively, in response to light incident thereon. In some embodiments, image sensors 210, 212, and 214 are each formed on substrate 208 using wafer-level fabrication techniques.

Optical blocks 216, 218, 220 are disposed in the height 206 direction on image sensors 210, 212, 214, respectively, to form image sensor/optical block pairs, such that the optical blocks are separated from each other in the lengthwise 202 direction. Thus, first optical block 216 is in optical communication with first image sensor 210 to form a first image sensor/optical block pair, second optical block 218 is in optical communication with second image sensor 212 to form a second optical block/image sensor pair, and third optical block 220 is in optical communication with third image sensor 214 to form a third optical block/image sensor pair. Each optical block 216, 218, 220 has a different optical configuration, such that each optical block has a different magnification. Therefore, the image sensor/optical block pairs of optical zoom imaging system 200 have respective field of view areas of different size, in their respective object planes.

First optical block 218 includes one or more first lens pieces 228, a first input reflective surface 234, and a first output reflective surface 236, separated from each other in the widthwise 204 direction, such that first optical block 218 has a horizontal configuration and an optical axis 237 parallel to outer surface 209. First input reflective surface 234 is structurally configured to reflect light incident on first optical block 218 onto first lens pieces 228, and first output reflective surface 236 is structurally configured to reflect light exiting first lens pieces 228 onto first image sensor 210. Thus, first lens pieces 228, first input reflective surface 234, and first output reflective surface 236 collectively form an optical relay to transfer light from a scene onto first image sensor 210. First input reflective surface 234 and first output reflective surface 236 are each implemented, for example, by a respective prism.

Figure 4:
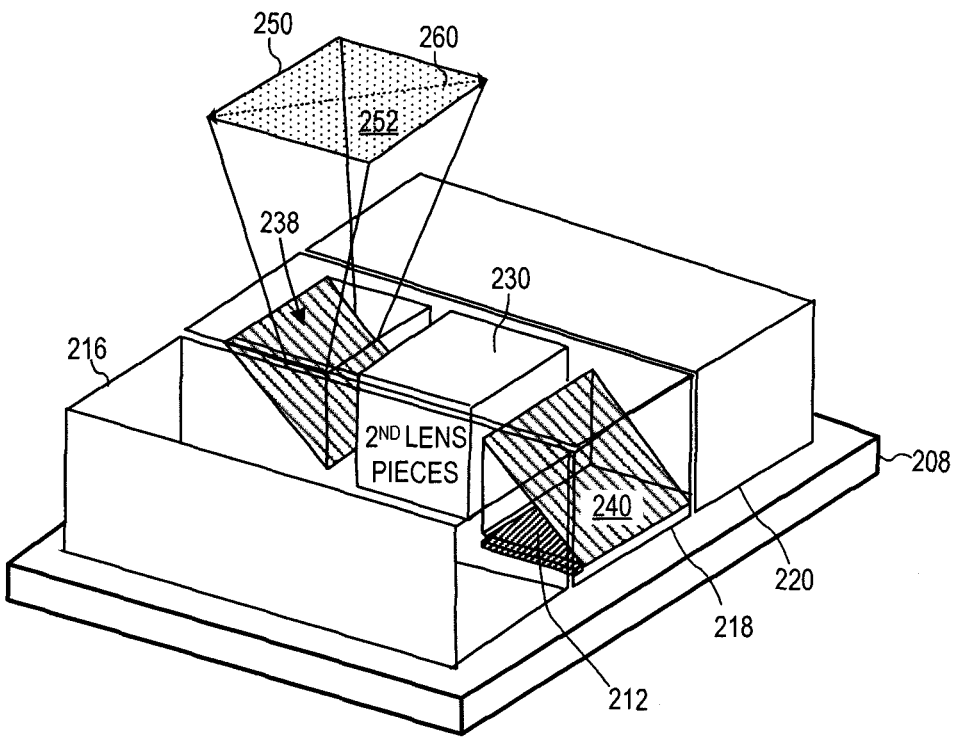
FIG. 4 illustrates a second optical block of the FIG. 2 optical zoom imaging system.
Figure 5:
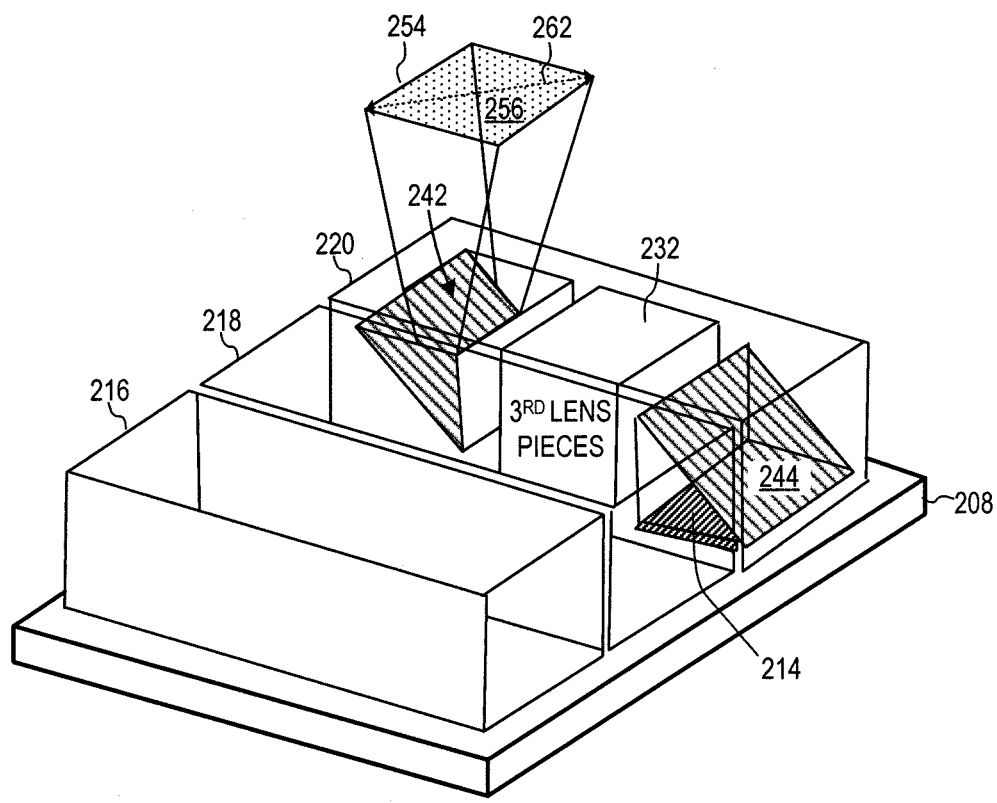
FIG. 5 illustrates a third optical block of the FIG. 2 optical zoom imaging system.

Second optical block 218 and third optical block 220 each include constituent elements similar to those of first optical block 216, and the constituent elements of the second and third optical blocks are arranged in a similar manner to those of first optical block 216. As illustrated in FIG. 4, second optical block 218 includes one or more second lens pieces 230, a second input reflective surface 238, and a second output reflective surface 240, which are arranged to transfer light from the scene onto second image sensor 212. As illustrated in FIG. 5, third optical block 220, in turn, includes one or more third lens pieces 232, a third input reflective surface 242, and a third output reflective surface 244, which are arranged to transfer light from the scene onto third image sensor 214. Optical blocks 216, 218, 220 may include additional elements, such as apertures and/or filters, without departing from the scope hereof.

As discussed above, the image sensor/optical block pairs of optical zoom imaging system 200 have respective field of view areas of different size, in their respective object planes. For example, in the embodiment shown, first image sensor 210 and first optical block 216 have a relatively large field of view area in their object plane, second image sensor 212 and second optical block 218 have a mid-size field of view area in their object plane, and third image sensor 214 and third optical block 220 have a relatively small field of view area in their object plane. Thus, first image sensor 210 generates first image data 222 representing a wide-zoom level, second image sensor 212 generates second image data 224 representing a mid-zoom level, and third image sensor 214 generates third image data 226 representing a narrow-zoom level. Accordingly, a wide-zoom, mid-zoom, or narrow-zoom level may be achieved simply by selecting between image data 222, 224, or 226, respectively, in a manner similar to that discussed above with respect to FIG. 1.

Figure 3:
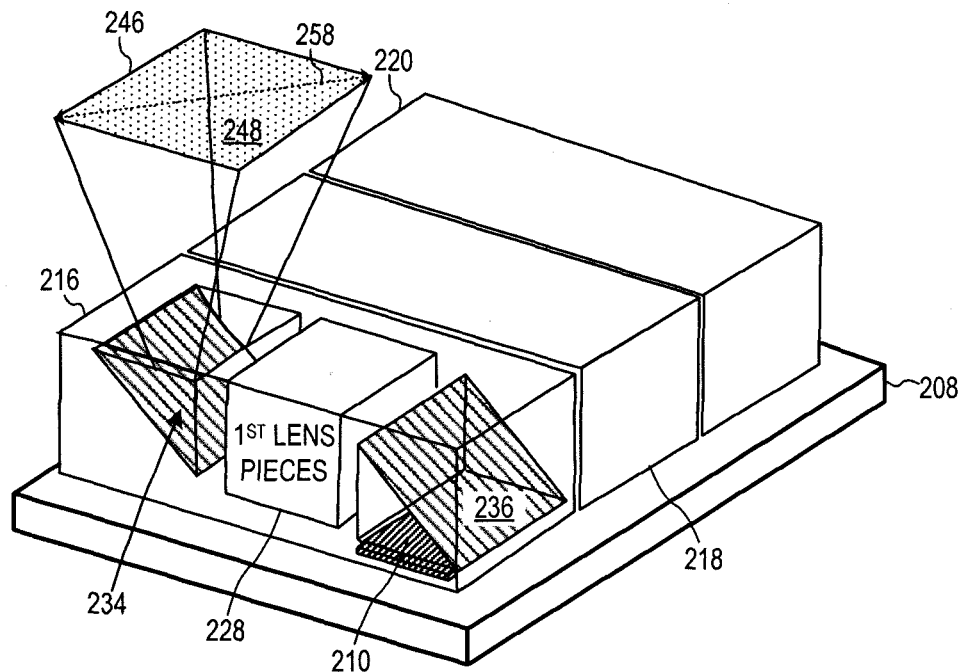
FIG. 3 illustrates a first optical block of the FIG. 2 optical zoom imaging system.
Figure 6:
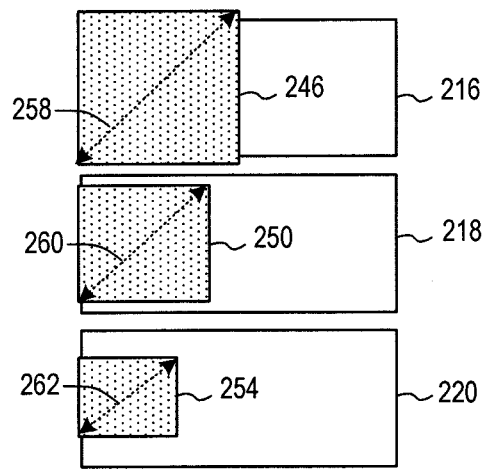
FIG. 6 is a top plan view of the FIG. 2 optical zoom imaging system illustrating field of view areas within the object planes for the first, second, and third optical blocks.

FIGS. 3-5 also respectively illustrate the field of view areas of optical blocks 216, 218, 220. As illustrated in FIGS. 3-5, first image sensor 210 and first optical block 216 have a first field of view area 246 in a first object plane 248, second image sensor 212 and second optical block 218 have a second field of view area 250 in a second object plane 252, and third image sensor 214 and third optical block 220 have a third field of view area 254 in a third object plane 256. FIG. 6 also illustrates first, second, and third field of view areas 246, 250, and 254 in top plan view. First field of view area 246 has a first dimension 258, second field of view area 250 has a second dimension 260, and third field of view area 254 has a third dimension 262, when measured diagonally. First dimension 258 is greater than second dimension 260, and second dimension 260 is greater than third dimension 262. Although field of view areas are shown in FIGS. 3-6 as being non-overlapping to promote illustrative clarity, the field of view areas could overlap without departing from the scope hereof.

The number of image sensor/optical block pairs of optical zoom imaging systems 100 and 200 could be varied without departing from the scope hereof, as long as the systems include at least two image sensor/optical block pairs. For example, in an alternate embodiment of optical zoom imaging system 200, second image sensor 212 and second optical block 218 are omitted to reduce cost and complexity, such that optical zoom imaging system 200 only has two zoom levels. As another example, some other alternate embodiments of optical zoom imaging system 200 include additional image sensor/optical block pairs, where each optical block has a different respective magnification, to achieve additional zoom levels.

Figure 7:
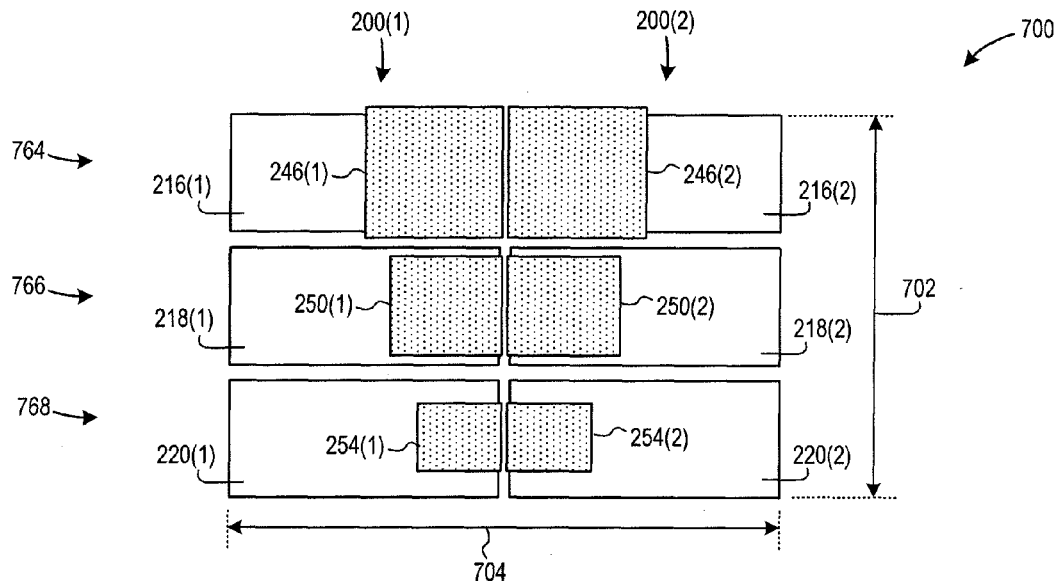
FIG. 7 is a top plan view of an array of the FIG. 2 optical zoom imaging systems, according to an embodiment.

Multiple instances of the optical zoom imaging systems disclosed herein could be combined to form an array. For example, FIG. 7 is a top plan view of an array 700 of two instances of optical zoom imaging system 200 of FIG. 2. In this document, specific instances of an item may be referred to by use of a numeral in parentheses (e.g., optical zoom imaging system 200(1)) while numerals without parentheses refer to any such item (e.g., optical zoom imaging systems 200). Array 700 includes left optical zoom imaging system 200(1) and right optical zoom imaging system 200(2) separated from each other in a widthwise 704 direction of array 700 such that corresponding optical blocks of each optical zoom imaging system are disposed in a common row. In particular, first optical blocks 216(1), 216(2) are disposed in a first row 764, second optical blocks 218(1), 218(2) are disposed in a second row 766, and third optical blocks 220(1), 220(2) are disposed in a third row 768. First, second, and third rows 764, 766, 768 each extend in the widthwise 704 direction, and the first, second, and third rows are separated from each other in a lengthwise 702 direction of array 700.

Right optical zoom imaging system 200(2) is a mirror image of left optical zoom imaging system 200(1). Therefore, first field of view areas 246 of first optical blocks 216 are adjacent in first row 764, second field of view areas 250 of second optical blocks 218 are adjacent in second row 766, and third field of view areas 254 of third optical blocks 220 are adjacent in third row 768. This configuration facilitates forming a single image from multiple optical zoom imaging systems 200. Additionally, in some embodiments, image sensors 210, 212, 214 of each optical zoom imaging system 200 are formed on a common substrate, such as using wafer-level fabrication techniques, to promote simple array 700 fabrication.

The number of instances of optical zoom imaging system 200 in array 700 could be increased with departing from the scope hereof. Moreover, optical zoom imaging systems 200 could be substituted with optical zoom imaging systems 100 of FIG. 1, in array 700.

Figure 8:
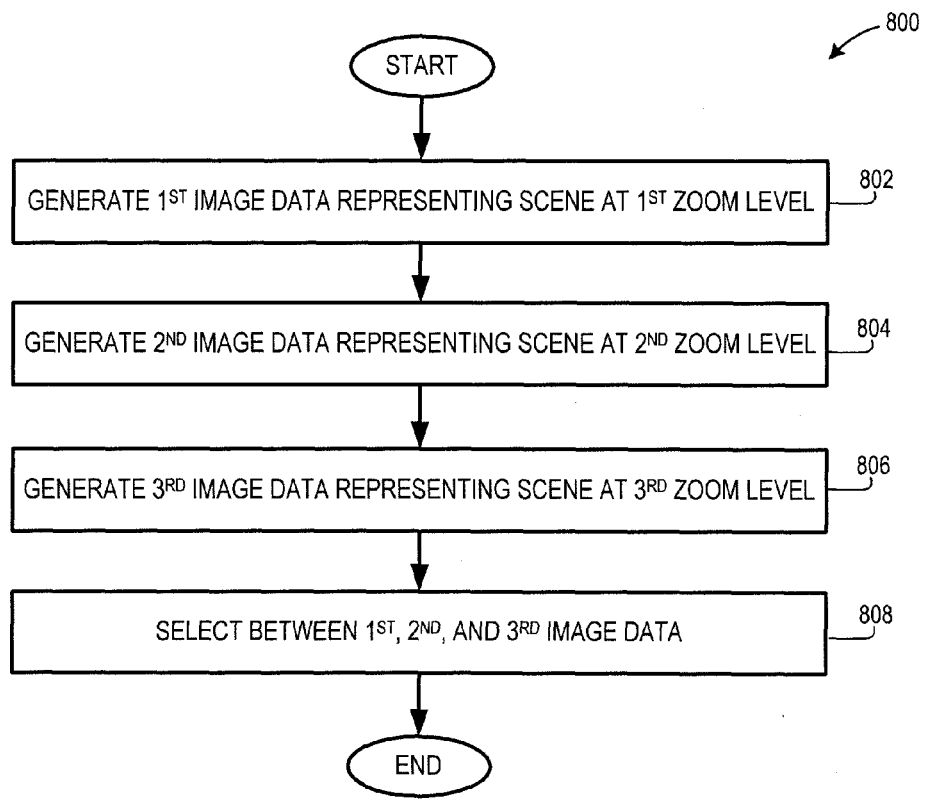
FIG. 8 is a flow chart illustrating a method for imaging a scene, according to an embodiment.

FIG. 8 illustrates a method 800 for imaging a scene. In step 802, a first image sensor in optical communication with a first optical block generates first image data representing the scene at a first zoom level. In one example of step 802, first image sensor 110 generates first image data 122, and in another example of step 802, first image sensor 210 generates first image data 222, representing a scene at a wide-zoom level. In step 804, a second image sensor in optical communication with a second optical block generates second image data representing the scene at a second zoom level, where the second zoom level is different from the first zoom level. In one example of step 804, second image sensor 112 generates second image data 124, and in another example of step 804, second image sensor 212 generates second image data 224, representing a scene at a mid-zoom level. In step 806, a third image sensor in optical communication with a third optical block generates third image data representing the scene at a third zoom level, where the third zoom level is different from the first and second zoom levels. In one example of step 806, third image sensor 114 generates third image data 126, and in another example of step 806, third image sensor 214 generates third image data 226, representing a scene at a narrow-zoom level. Although steps 802, 804, and 806 are illustrated being consecutively performed, two or more of steps 802, 804, and 806 could alternately be performed in parallel.

In step 808, one of the first, second, and third image data is selected based on a desired zoom level. In one example of step 808, one of first image data 122, second image data 124, and third image data 126 is selected based on a desired zoom level, and in another example of step 806, one of first image data 222, second image data 224, and third image data is selected based on a desired zoom level.

Method 800 could be modified to have fewer or greater image data generating steps, where each image data generating step corresponds to a respective zoom level. For example, in one alternate embodiment supporting only two zoom levels, step 806 is omitted, and step 808 is modified to select between only the first and second image data based on a desired zoom level.

It should be appreciated that the optical zoom imaging systems and associated methods disclosed herein could be used in conjunction with digital zoom techniques. For example, digital zoom techniques could be used to extend the number of zoom levels of optical zoom imaging system 100 or 200, albeit with potential image degradation associated with digital zoom techniques.

Combinations of Features

Features described above as well as those claimed below may be combined in various ways without departing from the scope hereof. The following examples illustrate some possible combinations:

(A1) An optical zoom imaging system may include (1) first and second image sensors disposed on a common substrate, and (2) first and second optical blocks in optical communication with the first and second image sensors, respectively. The first and second optical blocks may have different respective magnifications.

(A2) In the optical zoom imaging system denoted as (A1), the first optical block and the first image sensor may have a first field of view size, and the second optical block and the second image sensor may have a second field of view size different from the first field of view size.

(A3) In either of the optical zoom imaging systems denoted as (A1) or (A2): (1) the first optical block may include one or more first lens pieces, a first input reflective surface, and a first output reflective surface, (2) the first input reflective surface may be structurally configured to reflect light incident on the first optical block onto the one or more first lens pieces, (3) the first output reflective surface may be structurally configured to reflect light exiting the one or more first lens pieces onto the first image sensor, (4) the second optical block may include one or more second lens pieces, a second input reflective surface, and a second output reflective surface, (5) the second input reflective surface may be structurally configured to reflect light incident on the second optical block onto the one or more second lens pieces, and (6) the second output reflective surface may be structurally configured to reflect light exiting the one or more second lens pieces onto the second image sensor.

(A4) In the optical zoom imaging system denoted as (A3), the first and second image sensors may be disposed on an outer surface of the common substrate, and the first and second optical blocks may have respective first and second optical axes substantially parallel to the outer surface of the common substrate.

(A5) Either of the optical zoom imaging systems denoted as (A3) or (A4) may further include: (1) a third image sensor disposed on the common substrate, and (2) a third optical block in optical communication with the third image sensor. The first, second, and third optical blocks may have different respective magnifications.

(A6) In the optical zoom imaging system denoted as (A5): (1) the third optical block may include one or more third lens pieces, a third input reflective surface, and a third output reflective surface, (2) the third input reflective surface may be structurally configured to reflect light incident on the third optical block onto the one or more third lens pieces, and (3) the third output reflective surface may be structurally configured to reflect light exiting the one or more third lens pieces onto the third image sensor.

(A7) In the optical zoom imaging system denoted as (A6): (1) the first input reflective surface, the one or more first lens pieces, and the first output reflective surface may be separated from each other in the widthwise direction; (2) the second input reflective surface, the one or more second lens pieces, and the second output reflective surface may be separated from each other in the widthwise direction; and (3) the third input reflective surface, the one or more third lens pieces, and the third output reflective surface may be separated from each other in the widthwise direction.

(A8) In any of the optical zoom imaging systems denoted as (A5) through (A7): (1) the optical zoom imaging system may have length, width, and height; (2) the first, second and third image sensors may be separated from each other in the lengthwise direction; and (3) the first, second, and third optical blocks may be disposed over the first, second, and third image sensors, respectively, in the height direction.

(A9) In any of the optical zoom imaging systems denoted as (A5) through (A8), the first, second, and third image sensors may include a first, second, and third array of pixels, respectively.

(A10) In the optical zoom imaging system denoted as (A9), each of the first, second, and third arrays of pixels may include a respective color filter array selected from the group consisting of a Bayer color filter array, a cyan-yellow-green-magenta color filter array, and a red-green-blue-emerald color filter array.

(B1) An array may include a plurality of optical zoom imaging systems. Each of the plurality of optical zoom imaging systems may include (1) first and second image sensors, and (2) first and second optical blocks in optical communication with the first and second image sensors, respectively. In each of the plurality of optical zoom imaging systems, the first and second optical blocks may have different respective magnifications.

(B2) In the array denoted as (B1), in each of the plurality of optical zoom imaging systems, the first optical block and the first image sensor may have a first field of view size, and the second optical block and the second image sensor may have a second field of view size different from the first field of view size.

(B3) In either of the arrays denoted as (B1) or (B2), each of the plurality of optical zoom imaging systems may further include (1) a third image sensor, and (2) a third optical block in optical communication with the third image sensor. In each of the plurality of optical zoom imaging systems, the first, second, and third optical blocks may have different magnifications.

(B4) In the array denoted as (B3), the first, second, and third image sensors of each of the plurality of optical zoom imaging systems may be disposed on a common substrate.

(B5) In either of the arrays denoted as (B3) or (B4), the plurality of optical zoom imaging systems may be disposed such that: (1) the first optical blocks of the plurality of optical zoom imaging systems are disposed in a first row, (2) the second optical blocks of the plurality of optical zoom imaging systems are disposed in a second row, different from the first row, and (3) the third optical blocks of the plurality of zoom optical imaging systems are disposed in a third row, different from the first and second rows.

(B6) In any of the arrays denoted as (B3) through (B5), the plurality of optical zoom imaging systems may include left and right optical zoom imaging systems, and the left and right optical zoom imaging systems may be disposed such that: (1) a field of view area in an object plane of the first optical block of the left optical zoom imaging system is adjacent to a field of view area in an object plane of the first optical block of the right optical zoom imaging system, (2) a field of view area in an object plane of the second optical block of the left optical zoom imaging system is adjacent to a field of view area in an object plane of the second optical block of the right optical zoom imaging system, and (3) a field of view area in an object plane of the third optical block of the left optical zoom imaging system is adjacent to a field of view area in an object plane of the third optical block of the right optical zoom imaging system.

Changes may be made in the above methods and systems without departing from the scope hereof It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. An optical zoom imaging system, comprising:
   first, second, and third image sensors disposed on a common substrate; and
   first, second, and third optical blocks in optical communication with the first, second, and third image sensors, respectively;
   the first, second, and third optical blocks having different respective magnifications;
   the first optical block and the first image sensor having a first field of view size, the second optical block and the second image sensor having a second field of view size different from the first field of view size, and the third optical block and the third image sensor having a third field of view size different from the first and second field of view sizes;
   wherein:
      the first optical block comprises one or more first lens pieces, a first input reflective surface, and a first output reflective surface,
      the first input reflective surface is structurally configured to reflect light incident on the first optical block onto the one or more first lens pieces,
      the first output reflective surface is structurally configured to reflect light exiting the one or more first lens pieces onto the first image sensor,
      the second optical block comprises one or more second lens pieces, a second input reflective surface, and a second output reflective surface,
      the second input reflective surface is structurally configured to reflect light incident on the second optical block onto the one or more second lens pieces,
      the second output reflective surface is structurally configured to reflect light exiting the one or more second lens pieces onto the second image sensor,
      the third optical block comprises one or more third lens pieces, a third input reflective surface, and a third output reflective surface,
      the third input reflective surface is structurally configured to reflect light incident on the third optical block onto the one or more third lens pieces, and
      the third output reflective surface is structurally configured to reflect light exiting the one or more third lens pieces onto the third image sensor,
      the optical zoom imaging system has length, width, and height,
      the first, second and third image sensors are separated from each other in the lengthwise direction,
      the first, second, and third optical blocks are disposed over the first, second, and third image sensors, respectively, in the height direction,
      the first input reflective surface, the one or more first lens pieces, and the first output reflective surface are separated from each other in the widthwise direction,
      the second input reflective surface, the one or more second lens pieces, and the second output reflective surface are separated from each other in the widthwise direction, and
      the third input reflective surface, the one or more third lens pieces, and the third output reflective surface are separated from each other in the widthwise direction.

2. The optical zoom imaging system of claim 1, the first and second image sensors being disposed on an outer surface of the common substrate, the first and second optical blocks having respective first and second optical axes substantially parallel to the outer surface of the common substrate.

3. The optical zoom imaging system of claim 1, the first, second, and third image sensors comprising a first, second, and third array of pixels, respectively.

4. The optical zoom imaging system of claim 3, each of the first, second, and third arrays of pixels including a respective color filter array selected from the group consisting of a Bayer color filter array, a cyan-yellow-green-magenta color filter array, and a red-green-blue-emerald color filter array.

5. An array comprising a plurality of optical zoom imaging systems, each of the plurality of optical zoom imaging systems including:
   first, second, and third image sensors; and
   first, second, and third optical blocks in optical communication with the first second, and third image sensors, respectively;
   wherein in each of the plurality of optical zoom imaging systems, the first second, and third optical blocks have different respective magnifications; and
   wherein the plurality of optical zoom imaging systems comprises left and right optical zoom imaging systems, the left and right optical zoom imaging systems being disposed such that:
      a field of view area in an object plane of the first optical block of the left optical zoom imaging system is adjacent to a field of view area in an object plane of the first optical block of the right optical zoom imaging system,
      a field of view area in an object plane of the second optical block of the left optical zoom imaging system is adjacent to a field of view area in an object plane of the second optical block of the right optical zoom imaging system, and
      a field of view area in an object plane of the third optical block of the left optical zoom imaging system is adjacent to a field of view area in an object plane of the third optical block of the right optical zoom imaging system.

6. The array of claim 5, wherein in each of the plurality of optical zoom imaging systems, the first optical block and the first image sensor have a first field of view size, and the second optical block and the second image sensor have a second field of view size different from the first field of view size.

7. The array of claim 5, the first, second, and third image sensors of each of the plurality of optical zoom imaging systems being disposed on a common substrate.

8. The array of claim 5, the plurality of optical zoom imaging systems being disposed such that:
   the first optical blocks of the plurality of optical zoom imaging systems are disposed in a first row;
   the second optical blocks of the plurality of optical zoom imaging systems are disposed in a second row, different from the first row; and
   the third optical blocks of the plurality of zoom optical imaging systems are disposed in a third row, different from the first and second rows.

9. A method for imaging a scene, comprising:
   generating first image data representing the scene at a first zoom level using a first optical block in optical communication with a first image sensor;
   generating second image data representing the scene at a second zoom level using a second optical block in optical communication with a second image sensor, the second zoom level being different from the first zoom level;
   selecting between the first image data and the second image data based on a desired zoom level;

generating third image data representing the scene at a third zoom level using a third optical block in optical communication with a third image sensor, the third zoom level being different from the first and second zoom levels; and selecting between the first, second, and third image data based on a desired zoom level;

wherein:

the first optical block comprises one or more first lens pieces, a first input reflective surface, and a first output reflective surface, the first input reflective surface is structurally configured to reflect light incident on the first optical block onto the one or more first lens pieces, the first output reflective surface is structurally configured to reflect light exiting the one or more first lens pieces onto the first image sensor, the second optical block comprises one or more second lens pieces, a second input reflective surface, and a second output reflective surface, the second input reflective surface is structurally configured to reflect light incident on the second optical block onto the one or more second lens pieces, the second output reflective surface is structurally configured to reflect light exiting the one or more second lens pieces onto the second image sensor, the third optical block comprises one or more third lens pieces, a third input reflective surface, and a third output reflective surface, the third input reflective surface is structurally configured to reflect light incident on the third optical block onto the one or more third lens pieces, the third output reflective surface is structurally configured to reflect light exiting the one or more third lens pieces onto the third image sensor, the optical zoom imaging system has length, width, and height, the first, second and third image sensors are separated from each other in the lengthwise direction, the first, second, and third optical blocks are disposed over the first, second, and third image sensors, respectively, in the height direction, the first input reflective surface, the one or more first lens pieces, and the first output reflective surface are separated from each other in the widthwise direction, the second input reflective surface, the one or more second lens pieces, and the second output reflective surface are separated from each other in the widthwise direction, and the third input reflective surface, the one or more third lens pieces, and the third output reflective surface are separated from each other in the widthwise direction.

* * * * *